United States Patent
Liu et al.

(10) Patent No.: US 9,537,498 B2
(45) Date of Patent: Jan. 3, 2017

(54) METHOD AND SYSTEM FOR CHARGE COMPENSATION FOR SWITCHED-CAPACITOR CIRCUITS

(71) Applicant: Maxlinear, Inc.

(72) Inventors: Hao Liu, Carlsbad, CA (US); Yongjian Tang, Carlsbad, CA (US)

(73) Assignee: MaxLinear, Inc., Carlsbad, CA (US)

( * ) Notice: Subject to any disclaimer, the term of this patent is extended or adjusted under 35 U.S.C. 154(b) by 0 days.

(21) Appl. No.: 14/601,058

(22) Filed: Jan. 20, 2015

(65) Prior Publication Data

US 2015/0207518 A1 Jul. 23, 2015

Related U.S. Application Data

(60) Provisional application No. 61/929,276, filed on Jan. 20, 2014.

(51) Int. Cl.
*H03M 1/12* (2006.01)
*H03M 1/06* (2006.01)
*H03H 19/00* (2006.01)
*H03M 1/66* (2006.01)

(52) U.S. Cl.
CPC ......... *H03M 1/0604* (2013.01); *H03H 19/004* (2013.01); *H03M 1/0678* (2013.01); *H03M 1/12* (2013.01); *H03M 1/66* (2013.01)

(58) Field of Classification Search
USPC .................... 327/90–94, 554, 362, 378–382; 341/118–119, 155, 150
See application file for complete search history.

(56) References Cited

U.S. PATENT DOCUMENTS

| | | | | |
|---|---|---|---|---|
| 6,384,817 B1 * | 5/2002 | Janssen | ............... | G09G 3/2011 345/204 |
| 2009/0167430 A1 * | 7/2009 | Sharma | ................... | H03F 3/005 330/9 |
| 2016/0036407 A1 * | 2/2016 | Bach | .................... | H03H 7/0138 333/172 |

* cited by examiner

*Primary Examiner* — Dinh T Le
(74) *Attorney, Agent, or Firm* — McAndrews, Held & Malloy, Ltd.

(57) ABSTRACT

Methods and systems for charge compensation for switched-capacitor circuits may comprise, in an electronics device comprising a first voltage source, a switched capacitor load, and a switched capacitor compensation circuit: switching a capacitor in the switched capacitor load from a first voltage to a second voltage; providing a charge to the switched capacitor load from the switched capacitor compensation circuit without requiring added charge from the first voltage source. A reference voltage may be generated utilizing the first voltage source. A replica reference voltage for the switched capacitor compensation circuit may be generated utilizing a second voltage source. The replica reference voltage may be equal to the reference voltage. The replica reference voltage may be equal to a supply voltage, VDD, for circuitry in the electronics device. Capacitors may couple outputs of the first and second voltage sources to ground.

40 Claims, 5 Drawing Sheets

METHOD AND SYSTEM FOR CHARGE COMPENSATION FOR SWITCHED-CAPACITOR CIRCUITS

CROSS-REFERENCE TO RELATED APPLICATIONS/INCORPORATION BY REFERENCE

This application makes reference to and claims priority to U.S. Provisional Application Ser. No. 61/929,276 filed on Jan. 20, 2014. The above identified application is hereby incorporated herein by reference in its entirety.

FIELD

Certain embodiments of the disclosure relate to communication. More specifically, certain embodiments of the disclosure relate to charge compensation for switched-capacitor circuits.

BACKGROUND

Conventional switched-capacitor circuits can be inefficient and/or ineffective. Further limitations and disadvantages of conventional and traditional approaches will become apparent to one of skill in the art, through comparison of such systems with some aspects of the present invention as set forth in the remainder of the present application with reference to the drawings.

BRIEF SUMMARY

A system and/or method for charge compensation for switched-capacitor circuits substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Figure 1A:
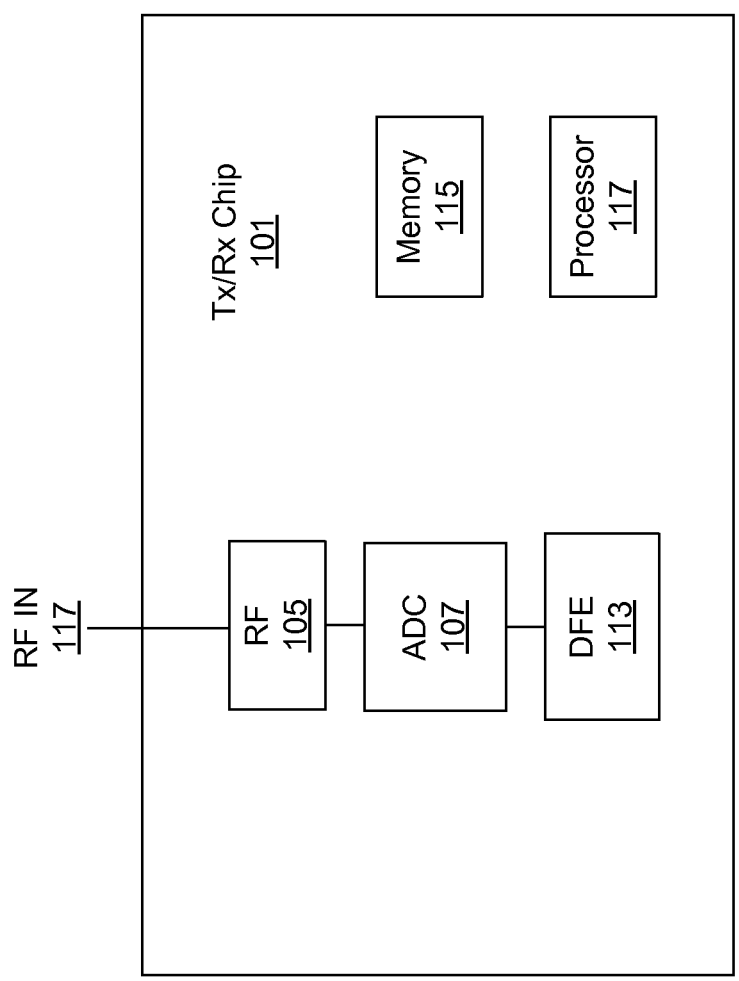
FIG. 1A is a diagram of an exemplary communication device with charge compensation for switched-capacitor circuits, in accordance with an example embodiment of the disclosure.

Certain aspects of the disclosure may be found in a method and system for charge compensation for switched-capacitor circuits. Exemplary aspects may comprise, in an electronics device comprising a first voltage source, a switched capacitor load, and a switched capacitor compensation circuit: switching a capacitor in the switched capacitor load from a first voltage to a second voltage; and providing a charge to the switched capacitor load from the switched capacitor compensation circuit without requiring added charge from the first voltage source. A reference voltage may be generated utilizing the first voltage source. A replica reference voltage for the switched capacitor compensation circuit may be generated utilizing a second voltage source. The replica reference voltage may be equal to the reference voltage. The replica reference voltage may be equal to a supply voltage, VDD, for circuitry in the electronics device. A first capacitor may couple an output of the first voltage source to ground and a second capacitor may couple an output of the second voltage source to ground. Capacitors in the switched capacitor load and the switched capacitor compensation circuit may be configured utilizing switch control logic that receives an output signal from a comparator at an output of the switched capacitor load. The electronics device may comprise an analog to digital converter (ADC). The switched capacitor load may comprise a digital to analog converter (DAC) in the ADC. The electronics device may comprise a switched capacitor filter.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y". As another example, "x, y, and/or z" means any element of the seven-element set $\{(x), (y), (z), (x, y), (x, z), (y, z), (x, y, z)\}$. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

FIG. 1A is a diagram of an exemplary communication device with charge compensation for switched-capacitor circuits, in accordance with an example embodiment of the disclosure. Referring to FIG. 1A, there is shown a receiver 101 chip comprising a radio frequency (RF) module 105, an analog-to-digital converter (ADC) 107, a digital front end (DFE) 113, a memory 115, and a processor 117. In an example scenario, the receiver chip comprises a single CMOS chip. In another example scenario, the receiver chip comprises a plurality of chips.

The receiver 101 may be in and/or part of a transceiver, for example, and may be utilized for receiving satellite television signals, cable television signals, or any RF signal carrying multiple channels of data desired by a user. In an example scenario, the receiver 101 may comprise a set-top box and/or set-top box functionality. In this example, the receiver 101 may be operable to receive satellite, cable, or terrestrial television signals, down-convert and process the signals for communication to a display device, such as a television, for example. In another example, the receiver 101 may comprise a wireless communication device. Furthermore, while FIG. 1A shows a Tx/Rx example, the disclosure is not so limited, as it may be applied to any switch capacitor loads.

The RF module 105 may comprise one or more RF receive (Rx) and transmit (Tx) paths for receiving signals from a signal source such as a satellite system, cable TV head-end, cellular towers, and/or terrestrial TV antennas, for example. The RF module 105 may comprise impedance matching elements, LNAs, power amplifiers, variable gain amplifiers, and filters, for example. The RF module 105 may thus be operable to receive, amplify, and filter RF signals before communicating them to the ADC 107.

The ADC 107 may comprise a wideband and/or time-interleaved ADC and may be operable to convert received analog signals to digital signals. In an example scenario, the ADC 107 may utilize charge compensation for switched-capacitor circuits which may reduce voltage ripple during operation.

The digital front end 113 may comprise circuitry for receiving samples from the ADC 107 and communicating them in a single data stream to the processor 117. The processor 117 may comprise a general purpose processor, such as a reduced instruction set computing (RISC) processor, for example, that may be operable to control the functions of the receiver 101. For example, the processor 117 may configure the switches 109 in an open or closed position. Additionally, the processor 117 may demodulate baseband signals received from the digital front end 113.

The memory 115 may comprise a programmable memory module that may be operable to store software and data, for example, for the operation of the receiver 101. Furthermore, the memory 115 may store switching states for the ADC 107 and switched capacitor configurations for charge compensation.

Figure 1B:
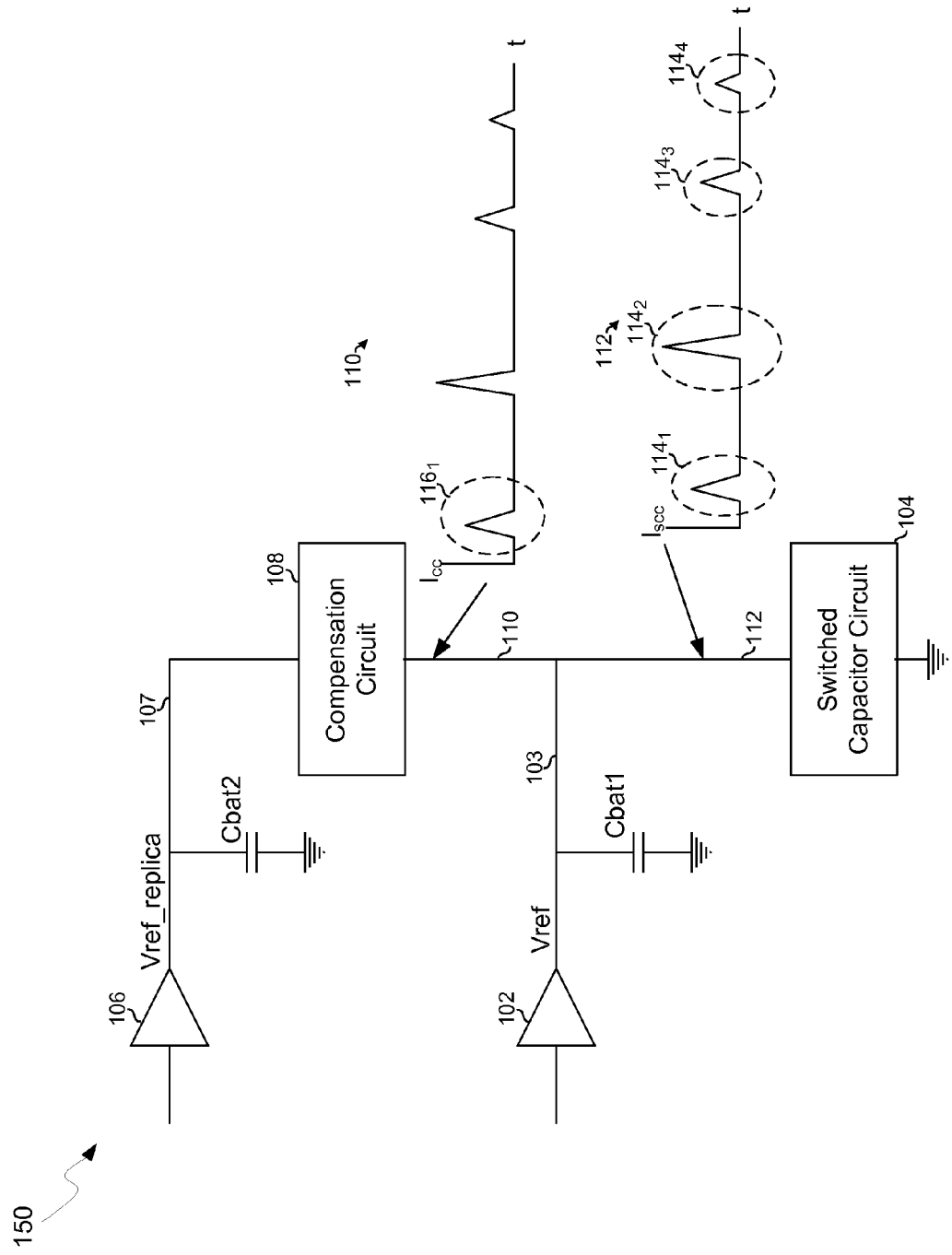
FIG. 1B depicts a switched capacitor circuit coupled to a charge compensation circuit in accordance with an example implementation of this disclosure.

FIG. 1B depicts a switched capacitor circuit coupled to a charge compensation circuit in accordance with an example implementation of this disclosure. Shown is a reference voltage generator buffer (reference generator) 102, a main switched capacitor (SC) circuit 104, a replica reference generator 106, and a switched capacitor compensation circuit 108.

In an example scenario, the SC circuit 104 comprises a digital-to-analog converter (DAC) for illustration, but the disclosure is not so limited as the SC circuit may comprise any switched capacitor circuit, such as a switched capacitor filter or voltage converter. Similarly, the compensation circuit 108 may also comprise a switched capacitor circuit, which may be operable to provide a current 110 to the SC circuit 104.

Reference generator 102 may comprise a voltage generator that is operable to hold node 103 at a voltage of Vref. Similarly, replica reference generator 106 may comprise a voltage source that provides a voltage at node 107 for compensation circuit 108. Replica reference generator 106 may hold node 107 at a voltage of Vref_replica. In another example scenario, node 107 may simply be tied to the supply voltage (VDD). For illustration, Vref_replica=Vref, but this need not be the case and some other voltage may be used depending on performance requirements and desired/possible capacitor sizing.

During switching, SC circuit 104 consumes a large current, as shown by current 112 in the plot to the right. This current may look like a spike at each switching of the switched capacitors in the SC circuit 104, such as one of the spikes 114. Without the circuits 106 and 108, in order for the SC circuit 104 to settle quickly, the reference generator 102 would need to be very low impedance so that it could provide such a large transient current. This would require complex circuitry and/or high power consumption in the reference generator 102.

The compensation circuit 108, however, may provide the required charge to the main SC circuit 104, as illustrated as the plot of current 110. This may be achieved by monitoring the capacitor network of the SC circuit 104 and providing the charge required by the SC circuit 104 at precisely the time that the charge is needed (i.e., during switching). As a result, the high frequency current during switching need not be provided by reference generator 102. This significantly relaxes the requirements of reference generator 102, which reduces power consumption and circuit complexity. Furthermore, the charge compensation circuit 108 may provide the charge faster than it could practically be provided by the reference generator 102, resulting in improved settling time of the node 103.

In the example implementation shown, a medium-size capacitor (Cbat1) is coupled to node 103 to relax the necessary timing and/or amplitude accuracy of the compensation. For example, use of Cbat1 may relax how accurately aligned in time the spike $116_1$ must be with the spike $114_1$ and/or how accurately the amplitude of spike $116_1$ must match the amplitude of the spike $114_1$. Any residual error after compensation can be provided by Cbat1. The capacitor Cbat1 may also help to reduce the power consumption of reference generator 106 since node 107 can be allowed to have much larger ripple compared to node 103. Without compensation circuit 108, Cbat1 would need to be impractically large to hold node 103 stable at Vref. Similarly, the addition of medium-sized capacitor (Cbat2) to node 107 may help reduce power consumption of reference generator 106 and may reduce time for node 107 to settle to Vref_replica.

Figure 2A:
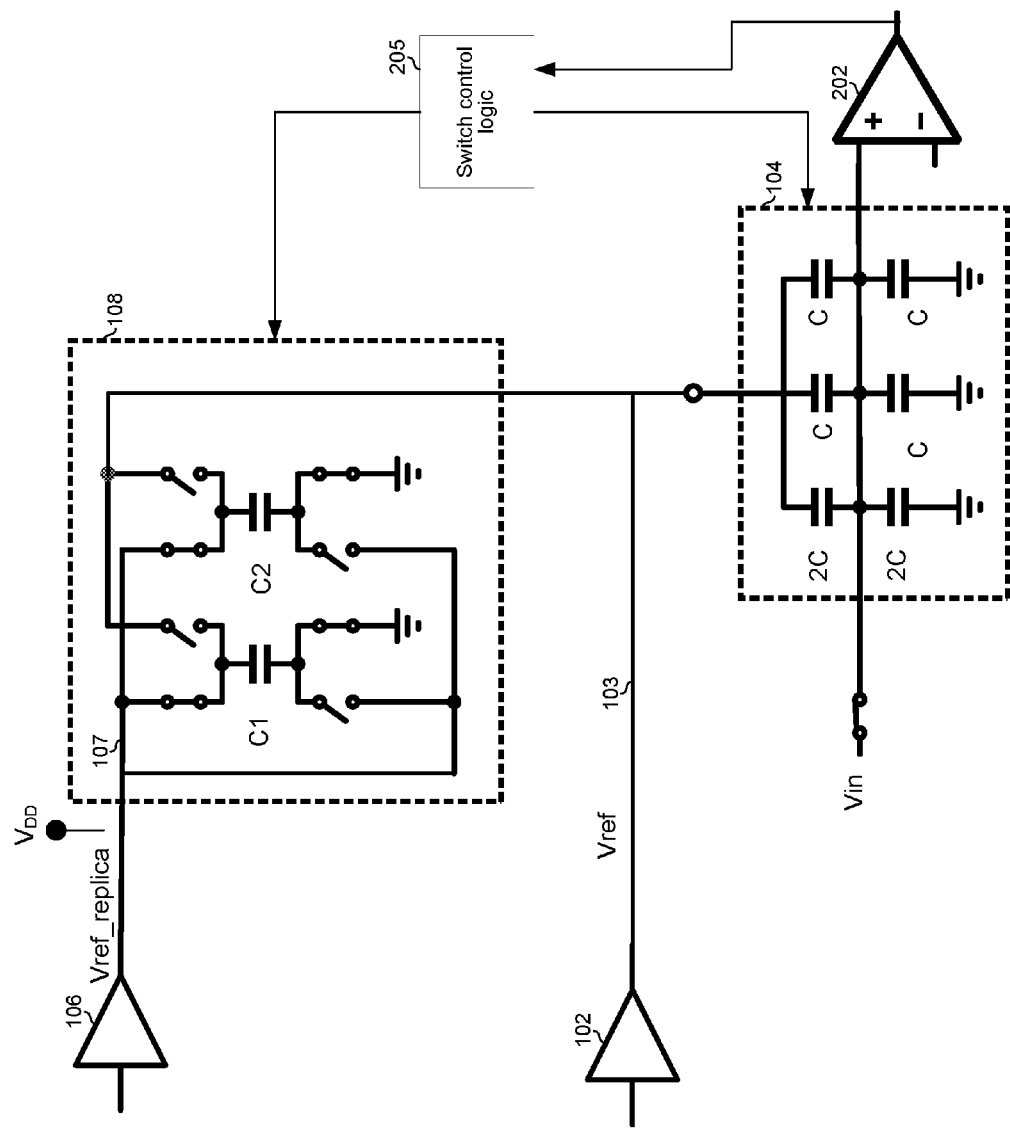
FIG. 2A depicts an example implementation of the circuits of FIG. 1B, during tracking.

FIG. 2A depicts an example implementation of the circuits of FIG. 1A, during tracking. Referring to FIG. 2A, there is shown reference generator 102, SC circuit 104, replica reference generator 106, charge compensation 108, a comparator 202, and switch control logic 205. For simplicity, a 2-bit single-end SC DAC is shown as an example of circuit 104. Accordingly, the SC circuit 104 may comprise capacitances C and 2C.

The switch control logic 205 may comprise suitable circuitry for controlling the switching of the capacitors in the SC circuit 104 and the compensation circuit 108. In addition, the switch control logic 205 may receive as an input the output of the comparator 102.

During tracking, half of each capacitor in SC circuit 104 is connected to node 103, and the other half is connect to ground. The capacitors C1 and C2 in compensation circuit 108 may be in recharge mode (i.e., bottom plate connected to ground and top plate connected to node 107. After tracking is finished, the comparator is ready for the first bit (MSB) conversion.

Figure 2B:
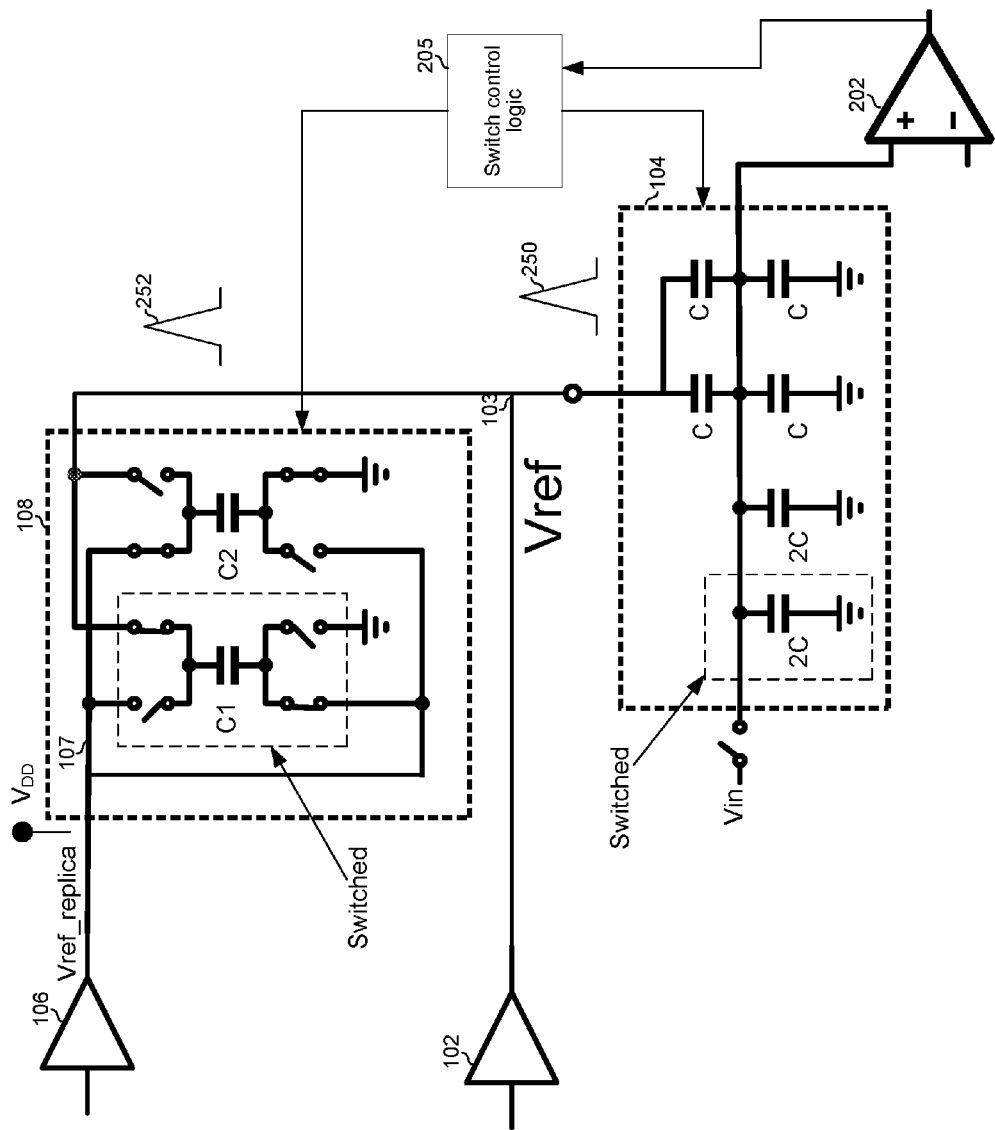
FIG. 2B depicts an example implementation of the circuits of FIG. 1B, after a switching.

FIG. 2B depicts an example implementation of the circuits of FIG. 1A, after a switching. Referring now to FIG. 2B, assuming, as an example for illustration, that the comparator 102 output is 1 for the first bit conversion, then the cap 2C in the SC circuit 104 is switched from Vref to gnd. The charge needed to be provided by node 103 thus equals Vref*C/2. The current drawn by the SC circuit 104 is shown as waveform 250. At the same time, the cap C1 in the compensation circuit 108 may be switched as follows: the top plate is switched from node 107 to node 103 and bottom plate is switched from ground to node 107. If C1=C/2, the charge provided by compensation circuit 108 is Vref_replica*C/2=Vref*C/2. Therefore, the charge required by the SC circuit 104 is fully provided by the compensation circuit 108. No current needs to be drawn from reference generator 102.

As another example, if a supply voltage VDD had been used instead of Vref_replica for node 107, the value of C1 would therefore be C*Vref/(2*VDD−Vref) to provide appropriate charge. As still another example, if VDD was used instead of Vref_replica and the bottom plate of C1 was not switched, then C1 would be C*Vref/(VDD−Vref) to provide the needed charge.

The same principle can be applied to subsequent switching steps in DAC 104. For example, for the second bit conversion, C2 in compensation circuit 108 may be used for compensation. For higher bit DACs, more compensation capacitors may be used. The value of cap required in compensation circuit 108 for each switching step depends on the cap network connection, which is known from the digital output of the comparator 102.

In an example implementation, this technique may be applied to only a subset of the bits of the SC circuit 104 to reduce the size and complexity of the compensation circuit 108.

As noted above, aspects of this disclosure reduce the power in reference generator 102 and also significantly improve the switched capacitor circuit, e.g., DAC, settling time and ADC conversion speed. As noted above, aspects of this disclosure apply to any type of switched-capacitor circuits, not limited to ADCs.

Figure 3:
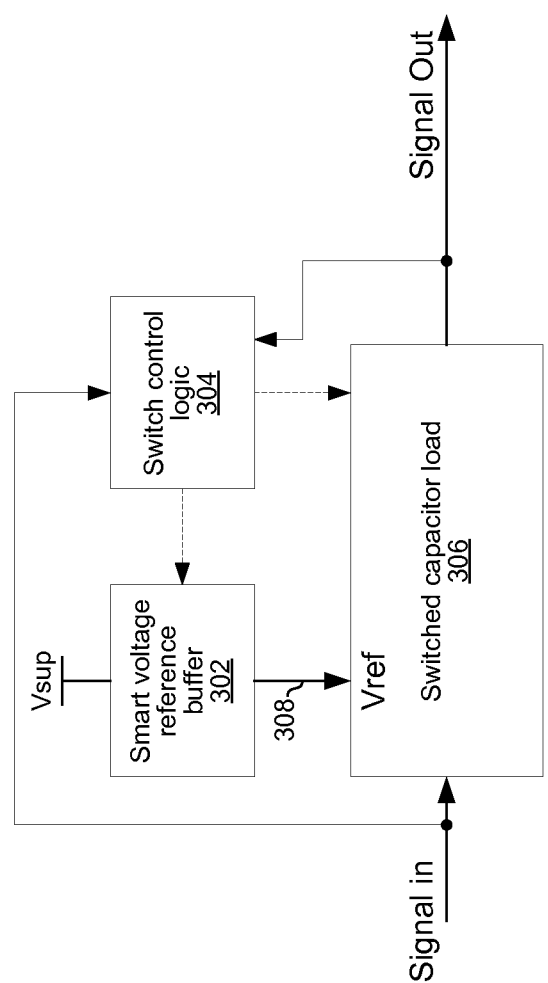
FIG. 3 depicts a generalized circuit for charge compensation.

FIG. 3 depicts a generalized circuit for charge compensation. Shown are a smart voltage reference buffer 302, switch control logic 304, and switched capacitor load 306. The load 306 may occasionally and/or periodically switch and draw charge from Vref to charge capacitors upon the switching events. The smart voltage reference buffer 302 may provide the precise amount of charge needed by load 306, at the precise times that such charge is needed, such that the voltage on 308 has little or no ripple.

The switch control logic 304 may control the switching of the load 306 (e.g., based on the signal in and/or the signal out of the load 306) and thus knows when the load 306 will need charge. The logic 304 can thus control the switching in the buffer 302 such that the precise amount of charge needed is provided at precisely the right time.

Accordingly, the smart voltage reference buffer 302 may comprise an array of switched capacitors that may be pre-charged and switched to provide charge at 308 for the switched capacitor load 306.

In an embodiment of the disclosure, a method for charge compensation for switched-capacitor circuits may comprise, in an electronics device comprising a first voltage source, a switched capacitor load, and a switched capacitor compensation circuit: switching a capacitor in the switched capacitor load from a first voltage to a second voltage; and providing a charge to the switched capacitor load from the switched capacitor compensation circuit without requiring added charge from the first voltage source. A reference voltage may be generated utilizing the first voltage source.

Similarly, in another embodiment of the disclosure, a system for charge compensation for switched-capacitor circuits may comprise one or more circuits comprising a first voltage source, a switched capacitor load, and a switched capacitor compensation circuit, where the one or more circuits are operable to: switch a capacitor in the switched capacitor load from a first voltage to a second voltage; and provide a charge to the switched capacitor load from the switched capacitor compensation circuit without requiring added charge from the first voltage source. A reference voltage may be generated utilizing the first voltage source.

In these embodiments, a replica reference voltage for the switched capacitor compensation circuit may be generated utilizing a second voltage source. The replica reference voltage may be equal to the reference voltage. The replica reference voltage may be equal to a supply voltage, VDD, for circuitry in the electronics device. A first capacitor may couple an output of the first voltage source to ground and a second capacitor may couple an output of the second voltage source to ground.

Capacitors in the switched capacitor load and the switched capacitor compensation circuit may be configured utilizing switch control logic that receives an output signal from a comparator at an output of the switched capacitor load. The electronics device may comprise an analog to digital converter (ADC). The switched capacitor load may comprise a digital to analog converter (DAC) in the ADC. The electronics device may comprise a switched capacitor filter.

In an another embodiment of the disclosure, a system for charge compensation for switched-capacitor circuits may comprise one or more circuits in an analog to digital converter (ADC) comprising a first voltage source, a switched capacitor load, a comparator, and a switched capacitor compensation circuit, where the one or more circuits are operable to: switch a capacitor in the switched capacitor load from a first voltage to a second voltage based on an output voltage of the comparator, and provide a charge to the switched capacitor load from the switched capacitor compensation circuit equal to the charge needed by the switched capacitor in the switched capacitor load without requiring added charge from the first voltage source.

Other embodiments of the disclosure may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for charge compensation for switched-capacitor circuits.

Accordingly, aspects of the disclosure may be realized in hardware, software, firmware or a combination thereof. The disclosure may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present disclosure may be implemented as a board level product, as a single chip, application specific integrated circuit (ASIC), or with varying levels integrated on a single chip with other portions of the system as separate components. The degree of integration of the system is primarily determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present disclosure may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present disclosure.

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A method for communication, the method comprising:
in an electronics device comprising a first voltage source, a switched capacitor load, and a switched capacitor compensation circuit, where an output of the first voltage source and an output of the switched capacitor compensation circuit are both coupled to a first node through which current is coupled to the switched capacitor load:
switching a capacitor in the switched capacitor load from a first voltage to a second voltage; and
providing charge to the switched capacitor load from the switched capacitor compensation circuit via the first node without requiring added charge from the first voltage source, wherein a first capacitor couples an output of the first voltage source to ground and a second capacitor couples an output of the second voltage source to ground.

2. The method according to claim 1, wherein the first voltage source generates a reference voltage for the switched capacitor load.

3. The method according to claim 2, comprising generating a replica reference voltage for the switched capacitor compensation circuit utilizing a second voltage source.

4. The method according to claim 3, wherein the replica reference voltage is equal to the reference voltage.

5. The method according to claim 3, wherein the replica reference voltage is equal to a supply voltage, VDD, for circuitry in the electronics device.

6. The method according to claim 1, comprising configuring capacitors in the switched capacitor load and the switched capacitor compensation circuit utilizing switch control logic that receives an output signal from a comparator at an output of the switched capacitor load.

7. The method according to claim 1, wherein the switched capacitor load comprises a digital to analog converter (DAC).

8. The method according to claim 1, wherein the switched capacitor load comprises a switched capacitor filter.

9. A system for processing signals, the system comprising:
one or more circuits comprising a first voltage source, a switched capacitor load, and a switched capacitor compensation circuit, where an output of the first voltage source and an output of the switched capacitor compensation circuit are both coupled to a first node through which current is coupled to the switched capacitor load, said one or more circuits being operable to:
switch a capacitor in the switched capacitor load from a first voltage to a second voltage; and
provide charge to the switched capacitor load from the switched capacitor compensation circuit via the first node without requiring added charge from the first voltage source, wherein a first capacitor couples an output of the first voltage source to ground and a second capacitor couples an output of the second voltage source to ground.

10. The system according to claim 9, wherein the first voltage source generates a reference voltage for the switched capacitor load.

11. The system according to claim 10, wherein said one or more circuits are operable to generate a replica reference voltage for the switched capacitor compensation circuit utilizing a second voltage source.

12. The system according to claim 11, wherein the replica reference voltage is equal to the reference voltage.

13. The system according to claim 11, wherein the replica reference voltage is equal to a supply voltage, VDD, for circuitry in the electronics device.

14. The system according to claim 9, wherein said one or more circuits are operable to configure capacitors in the switched capacitor load and the switched capacitor compensation circuit utilizing switch control logic that receives an output signal from a comparator at an output of the switched capacitor load.

15. The system according to claim 9, wherein the switched capacitor load comprises a digital to analog converter (DAC).

16. A system for processing signals, the system comprising:
one or more circuits in an analog to digital converter (ADC) comprising a first voltage source, a switched capacitor load, a comparator, and a switched capacitor compensation circuit, where an output of the first voltage source and an output of the switched capacitor compensation circuit are both coupled to a first node through which current is coupled to the switched capacitor load, said one or more circuits being operable to:
switch a capacitor in the switched capacitor load from a first voltage to a second voltage based on an output voltage of the comparator; and
provide charge to the switched capacitor load from the switched capacitor compensation circuit via the first node equal to the charge needed by the switched capacitor in the switched capacitor load without requiring added charge from the first voltage source, wherein the switched capacitor load comprises a digital to analog converter (DAC).

17. A method for communication, the method comprising:
in an electronics device comprising a first voltage source, a switched capacitor load, and a switched capacitor compensation circuit, where an output of the first voltage source and an output of the switched capacitor compensation circuit are both coupled to a first node through which current is coupled to the switched capacitor load:
    switching a capacitor in the switched capacitor load from a first voltage to a second voltage; and
    providing charge to the switched capacitor load from the switched capacitor compensation circuit via the first node without requiring added charge from the first voltage source, wherein capacitors in the switched capacitor load and the switched capacitor compensation circuit are configured utilizing switch control logic that receives an output signal from a comparator at an output of the switched capacitor load.

18. The method according to claim 17, wherein the first voltage source generates a reference voltage for the switched capacitor load.

19. The method according to claim 18, comprising generating a replica reference voltage for the switched capacitor compensation circuit utilizing a second voltage source.

20. The method according to claim 19, wherein the replica reference voltage is equal to the reference voltage.

21. The method according to claim 19, wherein the replica reference voltage is equal to a supply voltage, VDD, for circuitry in the electronics device.

22. The method according to claim 17, wherein the switched capacitor load comprises a digital to analog converter (DAC).

23. The method according to claim 17, wherein the switched capacitor load comprises a switched capacitor filter.

24. A method for communication, the method comprising:
    in an electronics device comprising a first voltage source, a switched capacitor load, and a switched capacitor compensation circuit, where an output of the first voltage source and an output of the switched capacitor compensation circuit are both coupled to a first node through which current is coupled to the switched capacitor load:
    switching a capacitor in the switched capacitor load from a first voltage to a second voltage; and
    providing charge to the switched capacitor load from the switched capacitor compensation circuit via the first node without requiring added charge from the first voltage source, wherein the switched capacitor load comprises a digital to analog converter (DAC).

25. The method according to claim 24, wherein the first voltage source generates a reference voltage for the switched capacitor load.

26. The method according to claim 25, comprising generating a replica reference voltage for the switched capacitor compensation circuit utilizing a second voltage source.

27. The method according to claim 26, wherein the replica reference voltage is equal to the reference voltage.

28. The method according to claim 26, wherein the replica reference voltage is equal to a supply voltage, VDD, for circuitry in the electronics device.

29. A system for processing signals, the system comprising:
    one or more circuits comprising a first voltage source, a switched capacitor load, and a switched capacitor compensation circuit, where an output of the first voltage source and an output of the switched capacitor compensation circuit are both coupled to a first node through which current is coupled to the switched capacitor load, said one or more circuits being operable to:
    switch a capacitor in the switched capacitor load from a first voltage to a second voltage; and
    provide charge to the switched capacitor load from the switched capacitor compensation circuit via the first node without requiring added charge from the first voltage source, wherein said one or more circuits are operable to configure capacitors in the switched capacitor load and the switched capacitor compensation circuit utilizing switch control logic that receives an output signal from a comparator at an output of the switched capacitor load.

30. The system according to claim 29, wherein the first voltage source generates a reference voltage for the switched capacitor load.

31. The system according to claim 30, wherein said one or more circuits are operable to generate a replica reference voltage for the switched capacitor compensation circuit utilizing a second voltage source.

32. The system according to claim 31, wherein the replica reference voltage is equal to the reference voltage.

33. The system according to claim 31, wherein the replica reference voltage is equal to a supply voltage, VDD, for circuitry in the electronics device.

34. The system according to claim 29, wherein said one or more circuits are operable to configure capacitors in the switched capacitor load and the switched capacitor compensation circuit utilizing switch control logic that receives an output signal from a comparator at an output of the switched capacitor load.

35. The system according to claim 29, wherein the switched capacitor load comprises a digital to analog converter (DAC).

36. A system for processing signals, the system comprising:
    one or more circuits comprising a first voltage source, a switched capacitor load, and a switched capacitor compensation circuit, where an output of the first voltage source and an output of the switched capacitor compensation circuit are both coupled to a first node through which current is coupled to the switched capacitor load, said one or more circuits being operable to:
    switch a capacitor in the switched capacitor load from a first voltage to a second voltage; and
    provide charge to the switched capacitor load from the switched capacitor compensation circuit via the first node without requiring added charge from the first voltage source, wherein the switched capacitor load comprises a digital to analog converter (DAC).

37. The system according to claim 36, wherein the first voltage source generates a reference voltage for the switched capacitor load.

38. The system according to claim 37, wherein said one or more circuits are operable to generate a replica reference voltage for the switched capacitor compensation circuit utilizing a second voltage source.

39. The system according to claim 38, wherein the replica reference voltage is equal to the reference voltage.

40. The system according to claim 38, wherein the replica reference voltage is equal to a supply voltage, VDD, for circuitry in the electronics device.

* * * * *